(12) United States Patent
Chen et al.

(10) Patent No.: US 7,479,355 B1
(45) Date of Patent: Jan. 20, 2009

(54) MASK DESIGN FOR ENHANCING LINE END RESOLUTION

(75) Inventors: Zheng G. Chen, Poughkeepsie, NY (US); Allen H. Gabor, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/037,968

(22) Filed: Feb. 27, 2008

(51) Int. Cl.
*G03F 1/00* (2006.01)
*G03C 5/00* (2006.01)
(52) U.S. Cl. .......................... 430/5; 430/322
(58) Field of Classification Search .............. 430/5, 430/322, 323, 324, 394
See application file for complete search history.

(56) References Cited

U.S. PATENT DOCUMENTS

| 2005/0238966 A1* | 10/2005 | Nolscher ............ 430/5 |
| 2006/0046160 A1 | 3/2006 | Wallace et al. |
| 2006/0251971 A1* | 11/2006 | Schenker ............ 430/5 |

OTHER PUBLICATIONS

Jinglei Du et al., New Approaches to Optical Proximity Correction in Photolithography, 1999 Elsevier Science B.V., 5 pages.

* cited by examiner

*Primary Examiner*—Stephen Rosasco
(74) *Attorney, Agent, or Firm*—Cantor Colburn LLP; Todd Li

(57) ABSTRACT

A mask design for enhancing line end resolution is provided. In an embodiment, a mask for use in patterning an underlying layer comprises opaque regions and transparent regions arranged to define a line having an end, a slit extending laterally through the line a spaced distance from the end of the line, and a feature extending above or below the space adjacent to the end of the line.

4 Claims, 2 Drawing Sheets

MASK DESIGN FOR ENHANCING LINE END RESOLUTION

TRADEMARKS

IBM® is a registered trademark of International Business Machines Corporation, Armonk, N.Y., U.S.A. Other names used herein may be registered tradenames, trademarks, or product names of International Business Machines Corporation or other companies.

BACKGROUND OF THE INVENTION

1. Field of the Invention

This invention relates to integrated circuits, and particularly to a lithographic mask design for enhancing line end resolution.

2. Description of Background

There are ongoing efforts to reduce the dimensions of integrated circuit features. Unfortunately, the ability to decrease the size of features is limited by the process used to pattern those features. Photolithography is the process by which the features of integrated circuits are currently patterned and involves transferring an optical image from a mask (or reticle) comprising opaque regions and transmissive regions to a photodefinable material. The photodefinable material possesses the ability to undergo a change in solubility in response to being exposed to appropriate radiation such as ultraviolet light.

Therefore, in photolithography, radiation can be passed through the transmissive regions of the mask to expose underlying regions of the photodefinable material and thereby alter the solubility of those regions. The photodefinable material can then be developed through chemical removal of either its exposed or unexposed regions, depending on the type of photosensitive material (i.e., positive tone or negative tone) being used. In this manner, a pattern is formed in the photodefinable material. One example of a photodefinable material is a photoresist, which in patterned form can be used to protect underlying regions of a layer of an integrated circuit from being removed by an etch technique. Once it has served its purpose, the photoresist layer can be chemically removed also.

The overall resolution of a photolithography process refers to the minimum feature size that can be adequately printed or "resolved" within specifications. This overall resolution depends on parameters such as the properties of the photodefinable material and any subsequent etch processes and the resolution of the optical lithography system, i.e., the ability to form a resolvable image pattern on the semiconductor topography. Due to the limits of this resolution, the pattern formed in the photodefinable material might not exactly match the pattern in the mask used to define this pattern, particularly as the size of the features in the pattern get smaller. For example, the ends of lines patterned in an integrated circuit device, e.g., an SRAM device, can be distorted or shortened due to optical effects.

SUMMARY OF THE INVENTION

The shortcomings of the prior art are overcome and additional advantages are provided through the provision of a mask design for enhancing line end resolution. In an embodiment, a mask for use in patterning an underlying layer comprises opaque regions and transparent regions arranged to define a line having an end, wherein a slit extends laterally through the line a spaced distance from the end of the line, and wherein a feature extends above or below a space adjacent to the end of the line.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Figure 1:
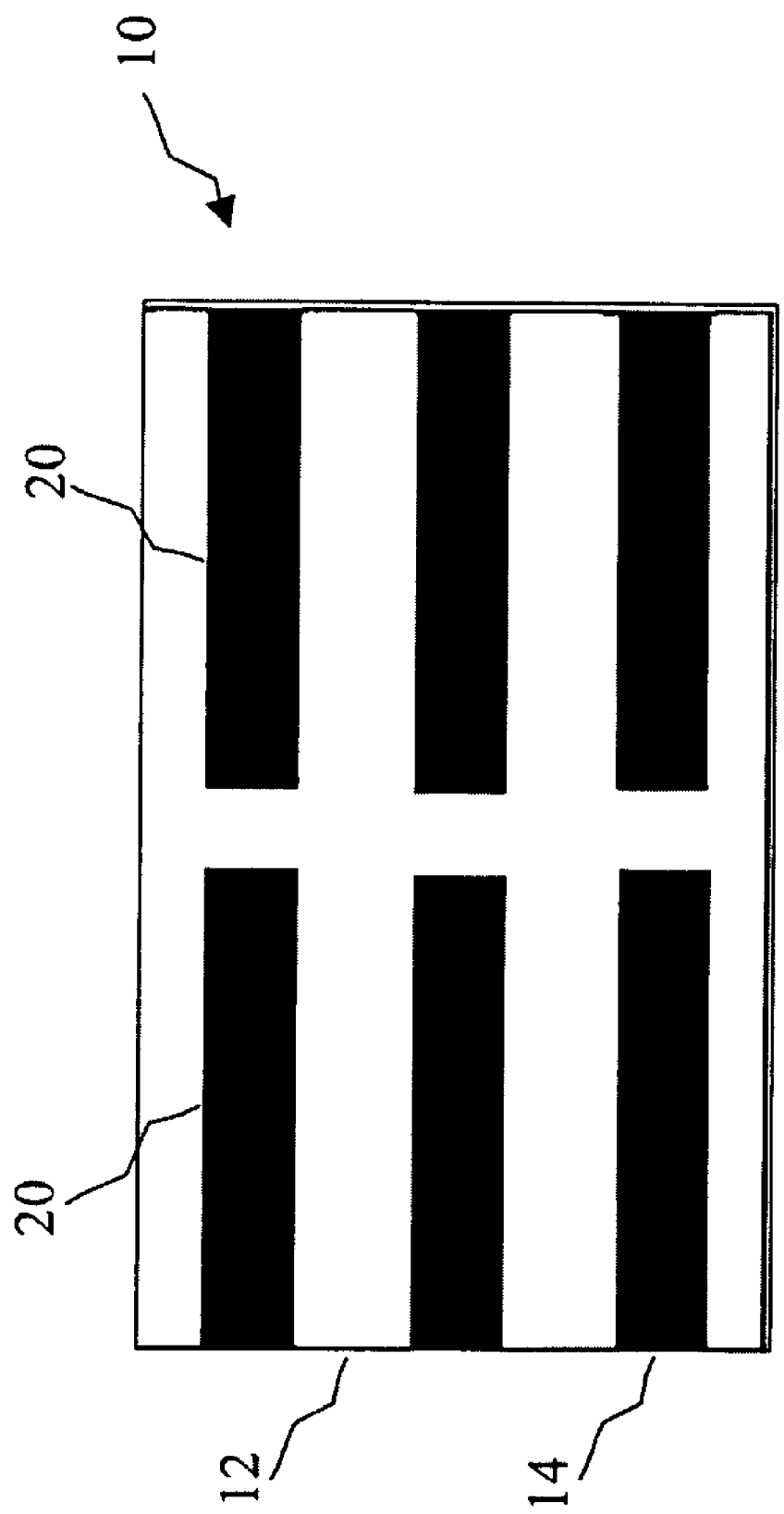
FIG. 1 illustrates a prior art example of a lithographic mask having a pattern formed thereon comprising end-to-end lines.

Turning now to the drawings in greater detail, FIG. 1 depicts a prior art mask 10 comprising transmissive regions 12 (indicated in white), e.g., transparent regions, for allowing the transmission of the radiation and opaque regions 14 (indicated in black) for blocking the transmission of radiation such as ultraviolet light. The transmissive regions 12 and the opaque regions 14 can be reversed depending on whether an underlying photodefinable layer (e.g., photoresist) is positive or negative toned. The mask 10 can comprise, e.g., a quartz plate, of which the opaque regions 14 are coated with, e.g., chrome.

In one embodiment, the transmissive regions 12 and the opaque regions 14 of the prior art mask 10 can be arranged to define end-to-end lines 20 on the mask 10. The resolution of a photolithography process used to pattern the lines 20 into an underlying photodefinable material can limit the minimal achievable dimensions of those lines 20. Also, the line end-to-end pattern fidelity can be limited by the resolution of small 2-dimentional features.

Various methods have been used to overcome this problem, including a double exposure process and a double etch process, which attempt to correct the mismatch between the mask pattern and the printed pattern. However, these methods undesirably increase the complexity and the cost of the overall process.

Figure 2:
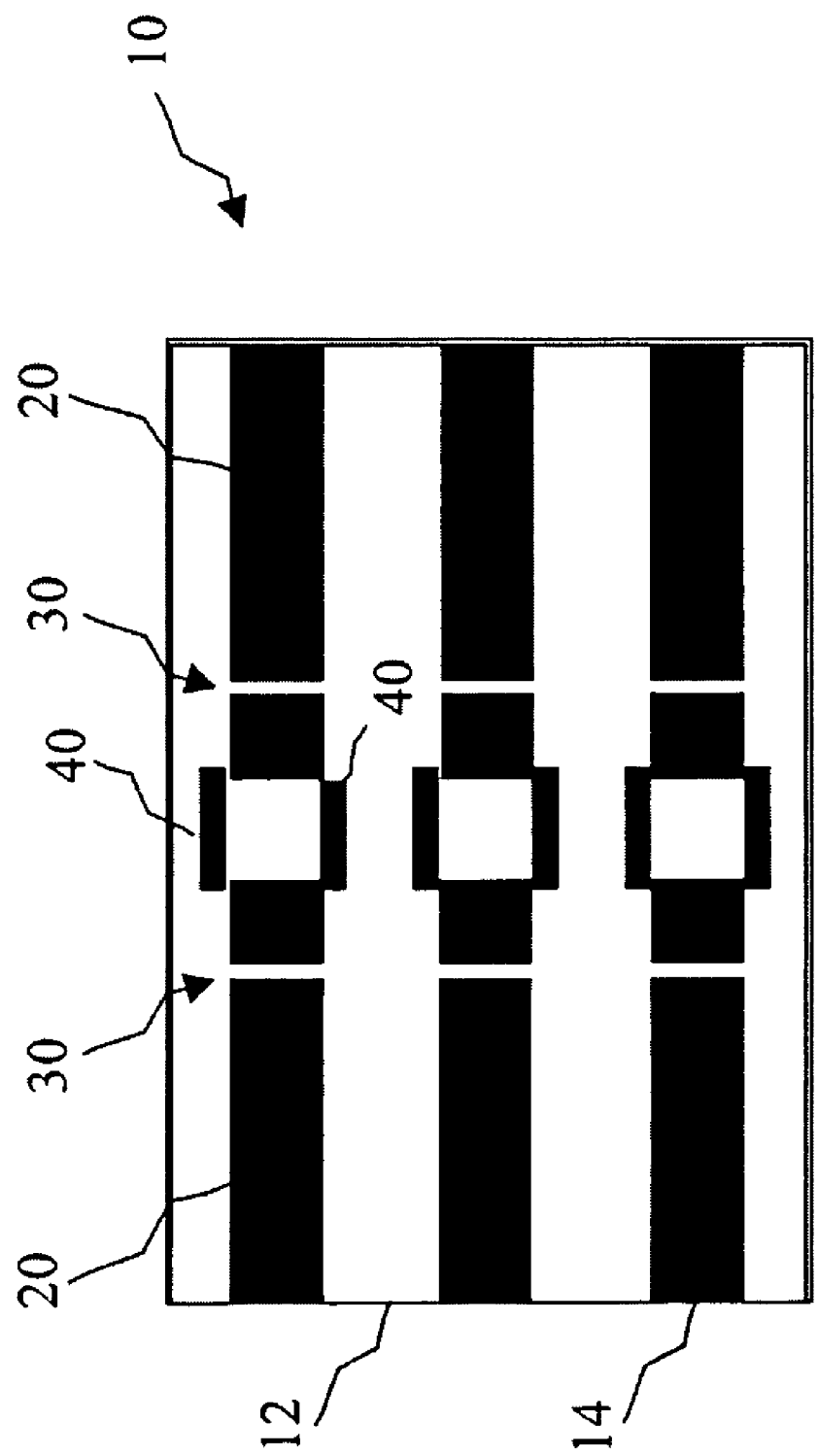
FIG. 2 illustrates one example of an improved mask having a pattern for enhancing the resolution of the line ends.

An improved mask design has been developed and is schematically illustrated in FIG. 2. As shown, the mask 10 can be altered by including opposite tone slits 30 extending laterally through the lines 20 at a spaced distance from the respective ends of the lines 20. The mask 10 can also be altered to include same tone features 40 extending horizontally above and below the space located between adjacent line ends. The features 40 can have sub-resolution dimensions (e.g., 20 to 25 nanometers). As used herein, "same tone" describes a feature having the same transmission properties as the lines 20, whereas "opposite tone" describes a feature having the opposite transmission properties as the lines 20. For example, if the lines 20 are transmissive (e.g., transparent), an opposite tone feature would be opaque, and a same tone feature would be transmissive.

The mask 10 depicted in FIG. 2 can be used to pattern an underlying photodefinable layer by first aligning the mask 10 to the photodefinable layer. The photodefinable layer can be formed above a layer of a semiconductor topography. Appropriate radiation such as visible or ultraviolet light can then be directed toward the mask 10 and the photodefinable layer using an optical lithography system. The radiation passes through the transmissive regions 12 of the mask 10 to expose regions of the photosensitive layer. After removal of the mask 10, the photodefinable layer can be contacted with a developer solution such as a base solution to develop the layer and thereby remove the unexposed or exposed regions of the layer. That is, the exposed regions are removed if the photodefinable layer is positive toned, and the unexposed regions are removed if the photodefinable layer is negative toned. In this manner, lines are patterned in the photodefinable layer that correspond to the lines 20 of the mask 10.

The mask design described herein advantageously enhances the contrast of the line end images projected onto the photodefinable material during photolithography by altering the diffraction pattern of the radiation being projected through the mask. Without intending to be limited by theory, it is believed that the mask design acts as a zone plate, i.e., a screen that alters the radiation being transferred, either in amplitude or phase, coming from every other half period zone. As a result, the optical image formed between the two line ends is sharper and narrower than that of current mask designs. Thus, the mask design described herein allows the resolution of small features, and hence the line end-to-end distance and the line end shape fidelity, printed in the photodefinable material to be improved using only one mask. This one-mask technique is much less complex and less costly than current solutions to the resolution problem. Further, it can be used in the fabrication of various types of integrated circuit devices, including SRAM and eDRAM devices, where small line end-to-end distance is required to increase device density.

As used herein, the terms "a" and "an" do not denote a limitation of quantity but rather denote the presence of at least one of the referenced items. Reference throughout the specification to "one embodiment", "another embodiment", "an embodiment", and so forth means that a particular element (e.g., feature, structure, and/or characteristic) described in connection with the embodiment is included in at least one embodiment described herein, and might or might not be present in other embodiments. In addition, it is to be understood that the described elements may be combined in any suitable manner in the various embodiments. Unless defined otherwise, technical and scientific terms used herein have the same meaning as is commonly understood by one of skill in the art to which this invention belongs.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A mask for use in patterning an underlying layer, comprising: opaque regions and transparent regions arranged to define a line having an end, wherein a slit extends laterally through the end of the line and a feature extends above or below a space adjacent to the end of the line, and wherein the slit is opposite tone and the feature is same tone relative to the line such that a combined effect of the slit and the feature enhances line end resolution.

2. The mask of claim 1, wherein the opaque regions and the transparent regions are arranged to define another line having another end laterally spaced from the end of the line with the space in between, wherein another slit extends laterally through said another end of the line.

3. The mask of claim 1, wherein another feature extends parallel to the feature in an opposed position above or below the space.

4. A method for using the mask of claim 1, comprising:
aligning the mask to an underlying photodefinable layer;
passing radiation through the transparent regions to the photodefinable layer to expose regions of the photodefinable layer; and
developing the photodefinable layer to remove unexposed or exposed regions of the photodefinable layer, thereby patterning a line in the photodefinable layer corresponding to the line of the mask.

* * * * *